United States Patent [19]

Watanabe et al.

[11] 4,173,770
[45] Nov. 6, 1979

[54] MANUAL TINT CONTROL CIRCUIT IN THE COLOR APFC LOOP MIXES TWO SUBCARRIER OSCILLATOR SIGNALS

[75] Inventors: Yasuaki Watanabe; Yukio Okabe, both of Yokohama, Japan

[73] Assignee: Victor Company of Japan, Limited, Japan

[21] Appl. No.: 913,331

[22] Filed: Jun. 7, 1978

[30] Foreign Application Priority Data

Jun. 9, 1977 [JP] Japan ................................ 52-68191

[51] Int. Cl.$^2$ .......................................... H04N 9/535
[52] U.S. Cl. ................................................. 358/28
[58] Field of Search ......................................... 358/28

[56] References Cited

U.S. PATENT DOCUMENTS

| 3,454,708 | 7/1969 | Curtis et al. | 358/28 |
| 3,483,316 | 12/1969 | Hickok | 358/28 |
| 3,743,764 | 7/1973 | Wittmann | 358/28 |
| 3,781,701 | 12/1973 | Cecchin et al. | 358/28 |

Primary Examiner—George G. Stellar
Attorney, Agent, or Firm—Lowe, King, Price & Becker

[57] ABSTRACT

A tint control circuit for color television receivers includes a voltage-controlled oscillator for locally generating a color subcarrier, a variable phase shifter shifting the phase of the generated subcarrier in dependence on a manually adjusted DC control voltage, and a phase detector which allows a received color burst to be supplied to a load circuit in dependence on the difference in phase between the color burst and the DC-controlled, variable phase-shifted subcarrier in order to derive a DC control voltage from the load circuit which controls the voltage-controlled oscillator.

5 Claims, 1 Drawing Figure

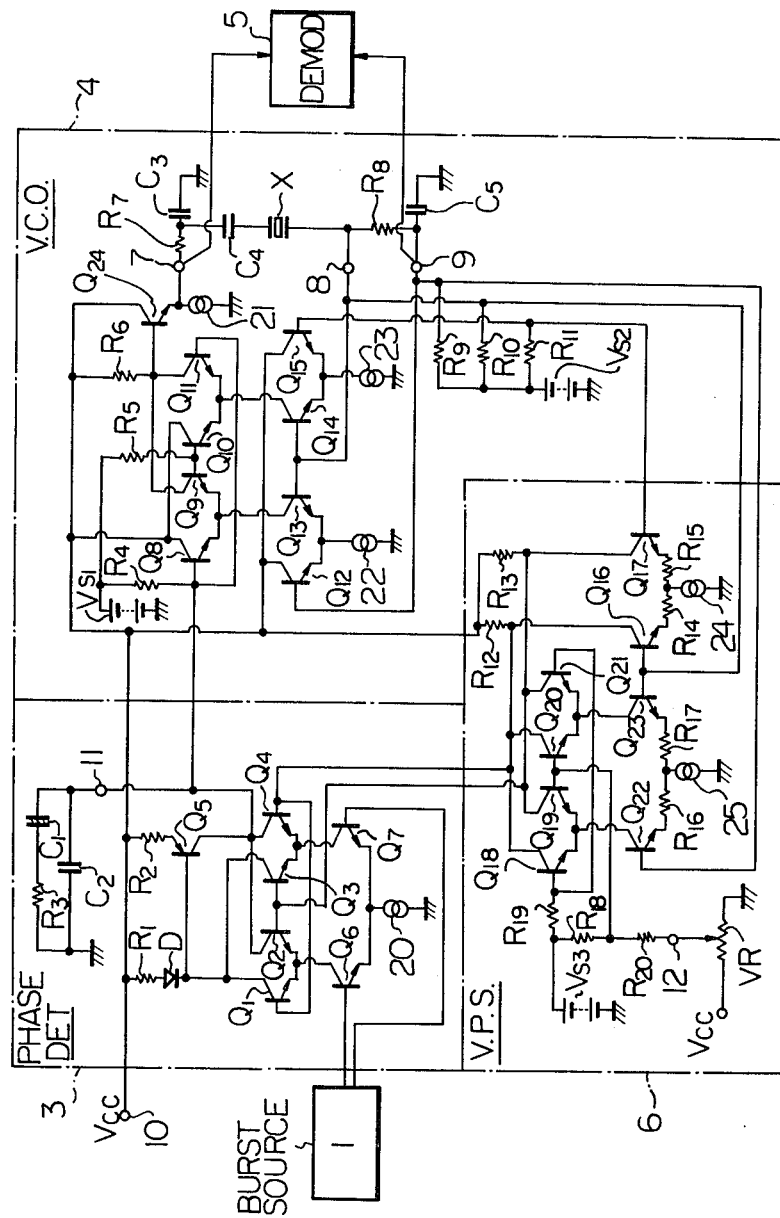

MANUAL TINT CONTROL CIRCUIT IN THE COLOR APFC LOOP MIXES TWO SUBCARRIER OSCILLATOR SIGNALS

BACKGROUND OF THE INVENTION

The present invention relates to a tint control circuit for color television receivers.

A tint control circuit for color television receivers usually comprises a phase-locked loop including a phase detector for detecting the difference in phase between the received color burst signal and a color subcarrier provided by a voltage-controlled oscillator to control the frequency of the latter in dependence on the phase difference representative DC voltage. For tint control purposes, manual phase shift of the subcarrier is effected by means of a variable phase shifter which is connected between the color burst source and the phase detector and such variable phase shifter comprises a capacitor, an inductor and a variable resistor which is provided on an accessible location. However, the adjustment of the variable resistor tends to produce an amplitude variation as well as the phase variation and as a result the phase detector might fail in detecting the correct phase difference, which results in a loss of control of the phase-locked loop. Furthermore, since the variable phase shifter is directly coupled to the high frequency signal, and since the variable phase shifter circuit lead runs a substantial length in the receiver, unwanted signals may easily be introduced to the phase shifter and cause a disturbance to the operation of the phase-locked loop.

SUMMARY OF THE INVENTION

A primary object of the present invention is to provide a novel tint control circuit for color television receivers which comprises a voltage-controlled oscillator for generating a color subcarrier, a variable phase shifter for shifting the phase of the generated subcarrier in dependence on a manually adjusted DC control voltage, and a phase detector which passes a received color burst to a load circuit in response to the variable phase-shifted subcarrier and smoothes the signal developed across the load circuit to derive a DC voltage which controls the voltage-controlled oscillator. Because of the gating or switching action of the phase detector in response to a DC-controlled, variable phase-shifted subcarrier signal, the prior art disadvantages are successfully removed.

BRIEF DESCRIPTION OF THE DRAWING

This and other objects and advantages of the invention will become apparent from the following detailed description with reference to the accompanying drawing which illustrates a preferred embodiment of the invention.

DETAILED DESCRIPTION

As illustrated in the drawing, the tint control circuit of the present invention for color television receivers comprises a phase-locked loop including a phase detector 3 connected to receive a color burst signal from a source 1, a voltage-controlled oscillator 4 for generating a color subcarrier whose frequency and phase are controlled in response to the DC signal from the phase detector 3, and a variable phase shifter 6 receptive of the subcarrier signal from the oscillator 4 to impart to the oscillator output a desired phase shift in accordance with a setting of a variable resistor VR provided on the front panel of the television receiver so as to control the phase detector 3 with the phase-shifted subcarrier.

The phase detector 3 is of a double-balanced phase detector which includes a first pair of switching transistors Q1 and Q2 and a second pair of switching transistors Q3 and Q4. The emitters of transistors in the first pair are connected together to the collector of a transistor Q6 and the emitters of transistors in the second pair are connected together to the collector of a transistor Q7. The bases of transistors Q6 and Q7 are connected to receive signals from the burst source 1 which are 180° out of phase relative to each other. The bases of transistors Q2 and Q3 are connected together and the bases of transistors Q1 and Q4 are connected together to receive output signals from the variable phase shifter 6. The collectors of Q2 and Q3 are cross-coupled to the collectors Q4 and Q1, respectively. The transistors Q6 and Q7 have their emitters connected together to ground via a constant-current circuit 20 to provide differential amplification of the input signals supplied from the source 1. The transistors Q1 through Q4 have their collectors connected to a circuit known as a "current mirror" circuit. This current mirror circuit is formed by a resistor R1 in series with a diode D between the voltage source terminal 10 and the collectors Q1 and Q3 and a resistor R2 in series with a transistor Q5 between the source terminal 10 and the collectors of Q2 and Q4. The base of transistor Q5 is connected to the cathode of the diode D which serves to establish a biasing point of the transistor Q5 so that the latter acts to maintain the current passing therethrough to have an equal value to the current passing through the diode D.

The color burst signal is amplified by Q6 and Q7 and switched on and off in response to the operation of the transistors Q1 through Q4 which are responsive to the output signals from the variable phase shifter 6. An output voltage is developed at the collectors of transistors Q2 and Q4, which output voltage is filtered through by means of an RC circuit formed by a resistor R3 and capacitors C1 and C2 connected from the collector of transistor Q4 through a terminal 11. When the tint control circuit of the invention is fabricated on an integrated-circuit chip which is a preferred embodiment, it is desirable that the RC filter circuit be constructed on a separate circuit board so as to save the space since the capacitor occupies a considerable area of an IC chip and in such cases the terminal 11 serves as an interface between the separate circuit boards.

The DC control signal from the phase detector 3 is coupled to the bases of transistors Q8 and Q11 of the voltage-controlled oscillator 4. Transistors Q8 and Q11 are arranged in a double-balanced differential amplifier configuration together with transistors Q9 and Q10 whose bases are connected together to a bias source VS1 through a resistor R5. Similarly, the bases of transistors Q8 and Q11 are connected to the bias source VS1 through a resistor R4. The collectors of transistors Q9 and Q10 are cross-coupled to the collectors of transistors Q11 and Q8, respectively, and thence to the voltage supply terminal 10. A load resistor R6 is interposed between voltage source 10 and the collector of Q11 to develop an output voltage thereacross, which voltage is coupled to the base of a transistor Q24 arranged in an emitter-follower configuration with a constant-current circuit 21 connected between the emitter of Q24 and ground. The emitters of transistors Q8 and Q9 are connected together to the collector of a transistor Q13 which forms a differential amplifier with a transistor Q12 and a constant-current circuit 22 which couples the emitters of Q12 and Q13 to ground. The emitters of transistors Q10 and Q11 are likewise connected together to the collector of a transistor Q14 which forms a differential amplifier with a transistor Q15 and a constant-current circuit 23 coupling the emitters of Q14 and Q15 to ground. The bases of Q13 and Q14 are coupled together to an output terminal 8. Between the emitter of Q24 and ground is connected a phase shifter formed by resistor R7 and capacitor C3 through an output terminal 7. Between terminals 7 and 8 is provided a crystal resonator X in series with a capacitor C4. The signal appearing at terminal 8 serves as a reference or zero phase angle signal to drive the transistors Q13 to Q14. The phase shifter R7, C3 is so adjusted to impart such a phase shift that the signal at terminal 7 is advanced in phase angle by 45° with respect to the signal at terminal 8. A second phase shifting circuit is provided which is formed by R8 and C5 coupled in series between the terminal 8 and ground with the junction therebetween being connected to an output terminal 9 which is in turn connected to the base of transistor Q12.

The phase shifter R8, C5 is to impart such a phase shift to the reference signal that the signal at terminal 9 has a constant phase lag of other than an integral multiple of 180°, which in this case is 45° relative to reference phase signal. Transistors Q12 through Q15 are biased by source voltage VS2 through resistors R9, R10 and R11 as illustrated, with the collectors of Q12, Q15 being connected together to the voltage source 10 and the collectors of Q13, Q14 being connected respectively to the emitters of transistors Q8 and Q9 arranged in a first differential amplifier configuration and to the emitters of Q10, Q11 arranged in a second differential amplifier configuration. The first and second differential amplifiers so constituted by transistors Q8 to Q11 control the mixing ratio of the current flow passing through the transistor Q13 and to the current flow passing through the transistor Q14 in such a manner that the subcarrier waveform developed across the load resistor R6 is maintained in a predetermined phase relation to the reference phase in accordance with the DC control signal from the phase detector 3.

For circuit integration, the output terminals 7 to 9 serve as an interface between the IC chip and a separate circuit board on which the phase shifting circuits R7, C3 and R8, C5 and the crystal resonator X are constructed.

The variable phase shifter 6 comprises a first pair of transistors Q16 and Q17 with their emitters interconnected via series-connected resistors R14 and R15 whose junction is coupled to ground through a constant-current circuit 24, and a second pair of transistors Q22 and Q23 with their emitters interconnected via series-connected resistors R16 and R17 the junction of which is coupled to ground through a constant-current circuit 25. The base of transistor Q17 of the first pair is connected to the bias source VS2 through resistor R11. The bases of transistors Q16 and Q23 are connected toghther to the output terminal 8 to receive the reference phase signal therefrom and biased through resistor R10 by means of the voltage source VS2, and the base of transistor Q22 is connected to the output terminal 9 to receive the −45° phase-shifted signal therefrom and biased through resistor R9 at the voltage of source VS2. It will be noted that the transistors Q16 to Q23 of the variable phase shifter 6 are arranged in the same circuit configuration to operate in the same way as the transistors Q12 to Q15 of the voltage-controlled subcarrier generator 4. The collectors of transistors Q16 and Q17 are connected to the voltage supply 10 through load resistors R12 and R13, respectively. On the other hand, the collector of transistor Q22 is connected to the load resistor R12 through the emitter-collector path of a transistor Q18 and to the load resistor R13 through the emitter-collector path of a transistor Q19 which forms a differential amplifier with the transistor Q18. Likewise, the collector of transistor Q23 is connected to the load resistor R12 through the emitter-collector path of a transistor Q20 and to the load resistor R13 through the emitter-collector path of a transistor Q21 which forms a differential amplifier with the transistor Q20. The bases of transistors Q18 and Q21 are connected together to a resistor R19 and thence to a bias voltage source VS3 and the bases of transistors Q19 and Q20 are connected together to a circuit junction between resistors R18 and R20 which are connected in series between the voltage source VS3 and the wiper terminal point 12 of the variable resistor VR connected between voltage supply Vcc and ground. The transistor pair Q16 and Q17 provides amplification of the reference phase signal from terminal 8 and develops amplified output signals across the load resistors R12 and R13, while the transistor pair Q22 and Q23 provides an amplified differential output signal from the signals supplied from terminals 8 and 9 and develops their output signals through the intermediary actions of transistors Q18 and Q21 across the load resistors R12 and R13. Therefore, the voltages developed across the load resistors R12 and R13 are the result of vector summation of the waveforms controlled by the actions of transistors Q18 and Q21 and the waveforms developed by the transistors Q16 and Q17. By varying the setting point of the variable resistor VR, the bias potentials applied to the bases of transistors Q18 and Q21 are controlled to regulate the currents supplied from the transistors Q22 and Q23 in opposite direction. More specifically, under equilibrium conditions when the base potentials of the transistors Q18 to Q21 are set at an equal value, the output signals of the transistors Q22 and Q23 are cancelled out each other in the load circuit through the action of their double-balanced differential amplification. Under non-equilibrium conditions when the base potential of transistors Q18 and Q21 has a different value from that of transistors Q19 and Q20, the output voltages of the transistors Q22 and Q23 are varied in polarity and amplitude relative to each other so that the resultant waveform developed in the load circuit accordingly varies in phase. The output signal so developed in the load circuit of the variable phase shifter 6 is coupled to the bases of transistors Q1 through Q4 of the phase detector 3 as a switching signal as described previously.

The output signal from the tint control circuit of the invention is available from the output terminals 7 and 9 which are connected to a demodulator 5. It is to be noted however that the output signal may also be available from terminals 8 and 9.

Since the tint control is effected by a DC control voltage in accordance with manual adjustment of the variable resistor, the tint control circuit of the invention is completely immune to unwanted high frequency signals which may be introduced to the connecting lead extending from the variable resistor mounted on the front panel of the television receiver. Furthermore, since the transistors Q1 through Q4 of the phase detector 3 have a constant threshold or switching level, the output of the phase detector 3 is not affected by the adjustment of the variable resistor VR.

What is claimed is:

1. A tint control circuit for a color television receiver comprising:
    a phase detector including a switching gate responsive to a control signal to pass a received color burst signal to a load circuit and a filter connected to the load circuit for deriving a DC phase detector output signal;
    a voltage-controlled oscillator for generating a color subcarrier signal of which the frequency and phase are variable in dependence on said DC phase detector output signal, said oscillator including means for shifting the phase of said subcarrier to provide a pair of subcarrier signals with a phase difference other than an integral multiple of 180° therebetween; and
    a variable phase shifter for mixing said subcarrier signals in a variable ratio in dependence on a manual setting value of a variable resistor to generate a variable phase-shifted subcarrier signal, the last-mentioned signal being said control signal of said phase detector.

2. A tint control circuit as claimed in claim 1, wherein said phase detector comprises a differential amplifier receptive of a pair of signals in opposite phase relation to each other from a source of a color burst to provide amplification of said signals, a double-balanced differential amplifier receptive of a pair of control signals to pass said amplified color burst signals to a load circuit in response to a respective one of said control signals, and a filter circuit connected to said load circuit for deriving a DC phase detector output signal, and wherein said voltage-controlled oscillator comprises means for shifting the phase of said subcarrier to provide a pair of subcarrier signals with a phase difference other than an integral multiple of 180° therebetween, and said variable phase shifter comprises a differential amplifier receptive of said subcarrier signals to provide amplification of the received signals and a double-balanced differential amplifier responsive to a manually controlled DC voltage to provide vector summation of said amplified subcarrier signals in a load circuit to derive a pair of output signals therefrom, the last-mentioned output signals being said control signals.

3. A tint control circuit as claimed in claim 1, wherein said voltage-controlled oscillator comprises a differential amplifier receptive of a pair of signals with a phase difference therebetween to provide amplification of said received signal, a double-balanced differential amplifier to provide vector summation of said amplified signals in a load circuit in dependence on said DC phase detector output signal, and a feedback circuit including a resonator and a phase shifter connected in series to said load circuit to derive a pair of mutually phase shifted signals from said phase shifter, the last-mentioned signals being said pair of signals received by said differential amplifier.

4. A tint control circuit as claimed in claim 3, wherein said variable phase shifter comprises a differential amplifier receptive of said pair of mutually phase shifted signals to provide amplification of the received signals and a double-balanced differential amplifier responsive to a manually controlled DC voltage to provide vector summation of said amplified mutually phase-shifted signals in a load circuit to derive a pair of output signals from the last-mentioned load circuit.

5. A tint control circuit as claimed in claim 3, further comprising a demodulator receptive of said mutually phase-shifted signals from said phase shifter.

* * * * *